United States Patent
Zohar et al.

(10) Patent No.: US 7,451,699 B2
(45) Date of Patent: Nov. 18, 2008

(54) DIGITAL APPLICATION OF PROTECTIVE SOLDERMASK TO PRINTED CIRCUIT BOARDS

(75) Inventors: Ron Zohar, Gan Yavne (IL); Jacob Mozel, Kfar Saba (IL); Ran Vilk, Kiron (IL)

(73) Assignee: Printar Ltd., Rehovot (IL)

( * ) Notice: Subject to any disclaimer, the term of this patent is extended or adjusted under 35 U.S.C. 154(b) by 384 days.

(21) Appl. No.: 10/503,804

(22) PCT Filed: Mar. 3, 2003

(86) PCT No.: PCT/IL03/00161

§ 371 (c)(1), (2), (4) Date: Apr. 18, 2005

(87) PCT Pub. No.: WO03/075623

PCT Pub. Date: Sep. 12, 2003

(65) Prior Publication Data

US 2005/0176177 A1    Aug. 11, 2005

(51) Int. Cl.
*B41J 2/01* (2006.01)
*H05K 3/14* (2006.01)
*H05K 3/40* (2006.01)

(52) U.S. Cl. .................. 101/483; 347/100; 347/102

(58) Field of Classification Search ............. None
See application file for complete search history.

(56) References Cited

U.S. PATENT DOCUMENTS

| | | | |
|---|---|---|---|
| 4,572,764 A | 2/1986 | Fan | |
| 4,572,925 A | 2/1986 | Scarlett | |
| 5,587,730 A | 12/1996 | Karz | |
| 5,793,392 A | 8/1998 | Tschida | |
| 5,965,944 A | 10/1999 | Frankoski et al. | |
| 5,984,455 A | 11/1999 | Anderson | |
| 6,030,072 A | 2/2000 | Silverbrook | |
| 6,849,308 B1 * | 2/2005 | Speakman et al. | 427/595 |
| 2002/0076919 A1 * | 6/2002 | Peters et al. | 438/637 |

FOREIGN PATENT DOCUMENTS

DE    198 42 379    5/2000

(Continued)

OTHER PUBLICATIONS

Machine translation of JP 07106470 to Mizuguchi from Japanese Patent Office website, Apr. 1995.*

(Continued)

*Primary Examiner*—Daniel J Colilla
(74) *Attorney, Agent, or Firm*—Ladas & Parry LLP

(57) ABSTRACT

A method and apparatus for applying ink, according to a soldermask pattern, to a printed circuit board having elevated pads defining pad edges, the method including flooding the printed circuit board with ink such that the ink advances to the pad edges and is stopped thereby and thereat, without climbing onto the elevated pads.

8 Claims, 5 Drawing Sheets

FOREIGN PATENT DOCUMENTS

| | | |
|---|---|---|
| EP | 0 440 027 | 8/1991 |
| EP | 1 163 552 | 8/2003 |
| JP | 01-255294 | 10/1989 |
| JP | 01 295489 | 11/1989 |
| JP | 07106740 A * | 4/1995 |
| JP | 08288621 A * | 11/1996 |
| JP | 09018115 A * | 1/1997 |
| JP | 09283893 A * | 10/1997 |
| JP | 2001249356 A * | 9/2001 |
| WO | WO 01/11426 | 2/2001 |
| WO | WO 02/01929 | 1/2002 |

OTHER PUBLICATIONS

Machine translation of JP 08288621 to Yumoto from Japanese Patent Office website, Nov. 1996.*
"Solder Mask" definition from Wikipedia, http://en.wikipedia.org/wiki/Solder_mask, printed on Jan. 2008.*
WO 01/11426 takes the place of EP 1 163 552 (art .158 of the EPC).
Patent Abstracts of Japan of JP 01-255294 dated Oct. 12, 1989.

* cited by examiner

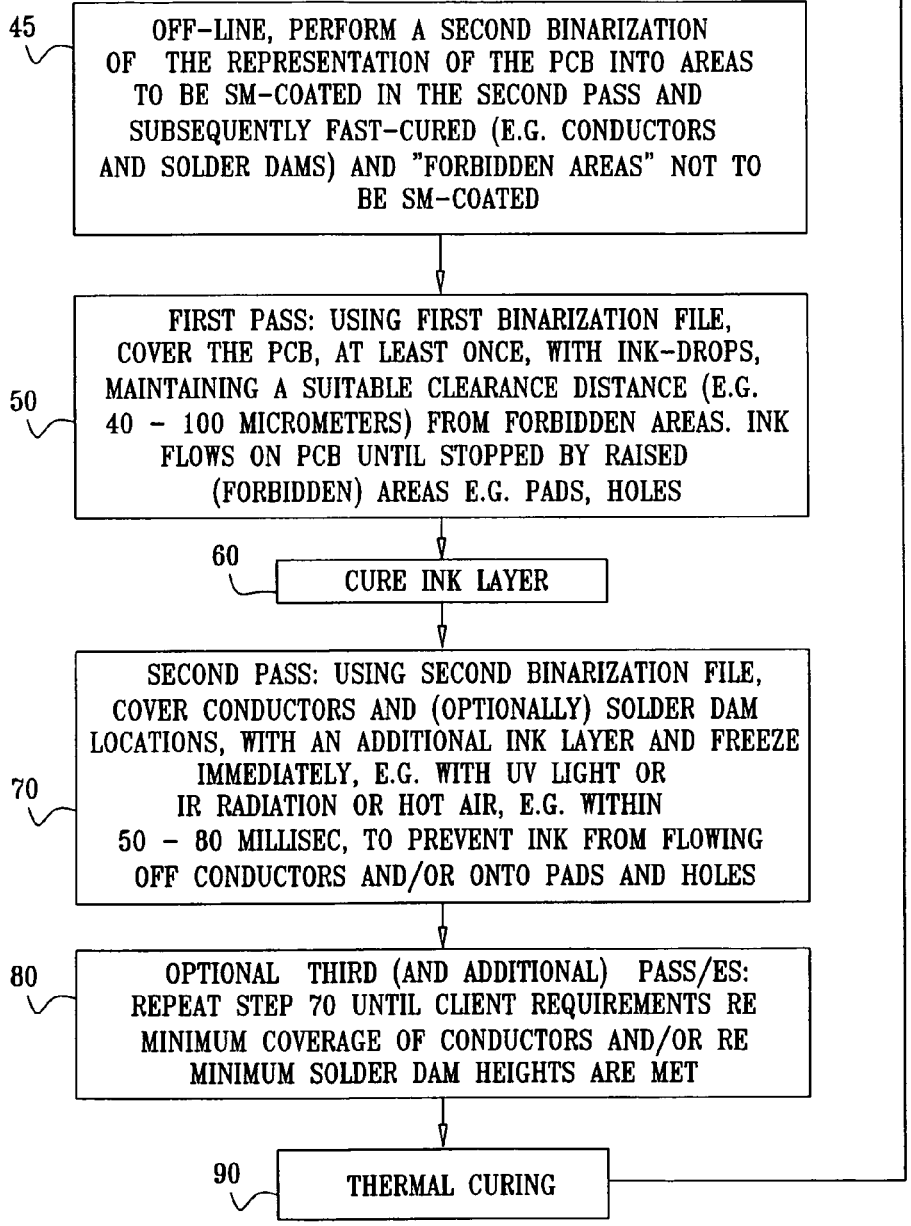

DIGITAL APPLICATION OF PROTECTIVE SOLDERMASK TO PRINTED CIRCUIT BOARDS

FIELD OF THE INVENTION

The present invention relates to apparatus and methods for applying protective soldermask to printed circuit boards.

BACKGROUND OF THE INVENTION

A simplified flowchart illustration of a conventional method of applying protective soldermask to PCBs (printed circuit boards) is shown in prior art FIG. 2. Step 150 may be effected using any conventional method such as "curtain coating" and "silkscreen" methods.

Published PCT application WO 02/01929 A2 describes a jet print-based apparatus and method for printed circuit board manufacturing.

The disclosures of all publications mentioned in the specification and of the publications cited therein are hereby incorporated by reference.

SUMMARY OF THE INVENTION

A common prior art method for soldermask application on high end PCBs is photolithography, which includes the following steps:
 (a) pre-clean and rinse of board
 (b) full coating of the panel with liquid photoimageable soldermask.
 (c) Tack free drying of both sides of the board,
 (d) exposure to actinic light through a phototool (usually under vacuum),
 (e) development,
 (f) cascade rinsing and
 (g) final curing of the board.

All of steps (b)-(f) are preferably avoided when soldermask is digitally applied in accordance with a preferred embodiment of the present invention, as described herein.

The present invention seeks to provide improved apparatus and methods for applying protective soldermask to printed circuit boards.

The methods for digital application of protective soldermask to printed circuit boards shown and described herein preferably entirely obviate the conventional photoimaging stage.

"Solder dams" are soldermask coated spaces between pads which due to the chemical composition of the soldermask repel solder, thereby to prevent electrical short circuiting between adjacent pads.

In applications in which the pads are very close together e.g. only approximately 75 micrometer apart, it is not possible, due to the limited accuracy of the photomask, to leave solder dams between the pads. This may cause short circuiting.

Also, for circuits with thick pads, even if it possible to leave a solder dam, the relatively narrow and tall solder dams are brittle which cause breakage which is detrimental to prevention of short circuiting. Furthermore, debris may stick to applied solder paste during assembly of the electronic components, which impedes adequate soldering during reflow.

When ink is applied to the PCB, the through holes are filled with ink which is not cured. If the aspect ratio (PCB thickness/PCB hole diameter) is high, the holes may not be cleaned properly in the development process which may impede solderability.

If via filling is desired, e.g. to improve vacuum applied during electrical testing, the density of drop ejection may be increased in the vicinity of the vias, so as to block the vias at least partly and preferably completely. A particular advantage of filling vias by increasing drop ejection density rather than by conventional LPISM (liquid photoimageable soldermask) application methods is that when LPISM application methods are used, due to the viscosity of LPISM relative to the inkjet ink typically used according to a preferred embodiment of the present invention, the entrapped air in vias may cause explosion during solder wave or reflow, which tends to produce numerous undesirable solder balls.

According to a preferred embodiment of the present invention, an ink jet is used to apply ink drops onto the PCB, thereby to generate closely overlapping ink spots. Since SMT (surface mounting technology) and TH (through hole) pads on the PCB are elevated relative to the plane of the PCB, each ink drop ejected by the jet typically, assuming drop ejection density is within a suitable range, spreads to the edge of any nearby elevated pad and stops just at the edge.

There is thus provided, in accordance with a preferred embodiment of the present invention, a method for applying ink, according to a soldermask pattern, to a printed circuit board having elevated pads defining pad edges, the method including flooding the printed circuit board with ink such that the ink advances to the pad edges and is stopped thereby and thereat, without climbing onto the elevated pads.

Also provided, in accordance with another preferred embodiment of the present invention, is a method for applying ink, in accordance with a soldermask pattern, to a printed circuit board, the method including using an ink jet to drop drops of ink onto the printed circuit board in accordance with the soldermask pattern, and freezing each drop of ink with actinic light within e.g. 100 milliseconds to prevent ink spread.

Further in accordance with a preferred embodiment of the present invention, the soldermask pattern includes a conductor having conductor edges and wherein the using step includes using the ink jet to eject ink drops onto the conductor edges.

Still further in accordance with a preferred embodiment of the present invention, the soldermask pattern includes at least one pair of adjacent pads and wherein the using step includes using the ink jet to eject ink drops between the pair of adjacent pads, thereby to generate a solder dam.

Still further in accordance with a preferred embodiment of the present invention, the actinic light includes UV light.

Additionally in accordance with a preferred embodiment of the present invention, the method also includes providing a printed circuit board having at least one holes and wherein the flooding step includes flooding the printed circuit board other than the immediate vicinity of the holes. If partial hole blockage is desired, this may be accomplished by increasing ink drop density adjacent the vias.

Still further in accordance with a preferred embodiment of the present invention, each hole has an aspect ratio of at least 10:1.

Further in accordance with a preferred embodiment of the present invention, the printed circuit board has at least one hole and the method also includes using the printed circuit board without cleaning the hole.

It is a particular feature of a preferred embodiment of the present invention that the solder mask, besides covering and protecting the conductors, prevents electrical short circuiting by chemically repelling the solder and solder balls from adhering to the board during the assembly process.

Another particular feature of the present invention is that straw formation substantially does not occur. When using conventional soldermask application methods, particularly for PCBs having high pads and conductors, undesirable "straws" tend to form. These are linear air bubbles along linear edges of SMT pads or conductors which are perpendicular to the direction of coating. Straw formation is problematic because the air trapped in a straw can explode at high solder temperatures, thereby generating undesirable solder balls.

Photoimageable definition of soldermask placement, as taught in the prior art, results in high edge definition. However, one of the limitations of state of the art photolithography processes is the difficulty in achieving good registration accuracy between the phototool and the PCB pads. This difficulty occurs due to small registration differences and PCB deformation between different boards within the same batch, and due to use of a single phototool for imaging the several dozen boards which may be included in each batch.

Phototool-PCB pad registration accuracy is conventionally achieved by leaving unexposed margins around pads, which result in formation of ditches around these pads. This phenomenon has motivated PCB manufacturers to decide that, for fine pitch components, the solder mask separation ("solder dam") between adjacent pads should be eliminated completely. This decision is problematic because of the importance of solder dams in eliminating short circuiting between adjacent pads during the subsequent solder reflow process.

When using an ink jet, it is desirable to achieve sharp edge definition comparable to the sharp edge definition achieved in conventional photolithographic PCB manufacturing. Minimizing drop volume is one possible route to obtaining sharp edge definition, however, minimizing drop volume significantly reduces printing speed, drop placement accuracy and throughput. A particular feature of a preferred embodiment of the present invention is that sharp edges are defined without using particularly small drops by flooding to the edges of existing raised features on a patterned object.

A particular advantage of a digital soldermask application provided in accordance with a preferred embodiment of the present invention is the possibility of image scaling for each board to take account small differences between the dimensions of different PCBs within the same batch. Ink jet drops can be placed accurately at predetermined point and area locations, allowed to flow for a certain time period until the nearest pads are reached, and then frozen e.g. using actinic light that will cure the photosensitive part of the liquid soldermask.

Subsequently, an additional layer of soldermask is preferably printed, e.g. to ensure coverage of conductor edges, to build up solder dams, to add a logo or for any other reason. The additional layer is frozen as soon as possible after it reaches the media, e.g. by UV curing, by exposure to IR radiation and/or by application of hot air. This immediate freeze prevents the ink drops from flowing off the conductors and allows higher solder dams to be built above the first cured layer that was allowed to spread before curing. Subsequent prints of the ink may be applied selectively in one or more passages to ensure provision of a sufficiently thick coating of problematic sites, such as conductor edges.

Additional advantages to application of soldermask by one of the flooding methods of the present invention, rather than by the photoimaging methods known in the art, include:

(a) Increased mechanical strength of solder dams, for applications with thick copper pads. In conventional photoimaging processes, due to ditch formation around the pads, the solder dams formed are relatively high and narrow and are prone to mechanical breakage. In contrast, dams generated by flooding in accordance with a preferred embodiment of the present invention, are not high or narrow and hence have increased mechanical strength.

(b) Typically, processing of a PCB e.g. electroless tin processing of a PCB, involves various stages each taking place in a different chemical solution. If ditches are present in the PCB, chemicals e.g. electroless tin, from a particular stage tend to contaminate the solution of a subsequent stage due to accumulation of these chemical in the hard-to-rinse ditches.

Ditches also tend to entrap solder balls. The presence of solder balls on a PCB is undesirable since they can cause short circuiting during the lifetime of the electronic board.

During the assembly process, flux tends to become entrapped in ditches. Subsequently, once the PCB has been installed inside electronic equipment, the trapped flux may cause corrosion of electrical components on the PCB.

A particular advantage of a preferred embodiment of the present invention is that ditch formation is substantially avoided, thereby substantially eliminating the above problems.

(c) Alleviation of another problem which tends to occur as a PCB is coated with a thick copper outer layer, namely coating close to the high pads and conductors. When using curtain coater or silkscreen, air may be entrapped at the conductor and glass epoxy. This phenomenon, known as the "straw effect", generally does not occur when the digital application process of the present invention is used.

(d) In applications which involve thick boards with a high aspect ratio, liquid solder mask may enter the plated holes while the liquid photoimageable solder mask (LPISM) is being applied by a curtain coater or silkscreen. During the conventional development process it is difficult to entirely clear away the soldermask material after the soldermask has been tack-free dried. If traces of liquid solder mask remain in the holes, the through hole assembly of the components may be faulty. When using the digital print methods shown and described herein, the ink typically never approaches the plated holes. Therefore, the PCB can be used without cleaning the holes because hole cleaning becomes unnecessary.

A particular advantage of a preferred embodiment of the methods shown and described herein is that the time-consuming and costly phototooling step (175 in prior art FIG. 2) which is part of conventional soldermask application methods, may be entirely eliminated.

BRIEF DESCRIPTION OF THE DRAWINGS

The present invention will be understood and appreciated from the following detailed description, taken in conjunction with the drawings in which:

FIGS. 1A-1B, taken together, form a simplified flowchart illustration of a method, constructed and operative in accordance with a preferred embodiment of the present invention, for digital application of protective soldermask to printed circuit boards;

DETAILED DESCRIPTION OF PREFERRED EMBODIMENTS

Figure 1A:
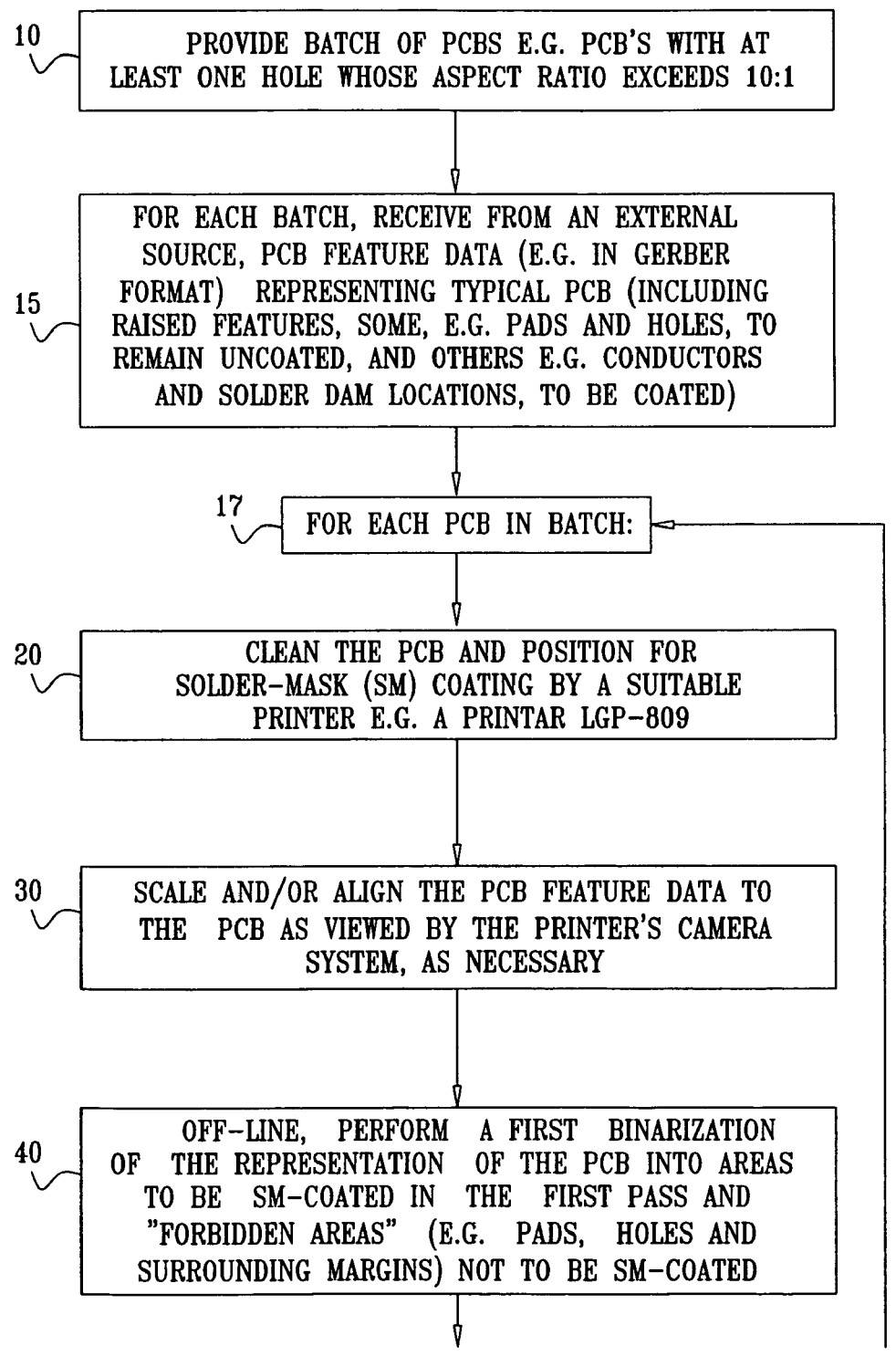
Figure 2:
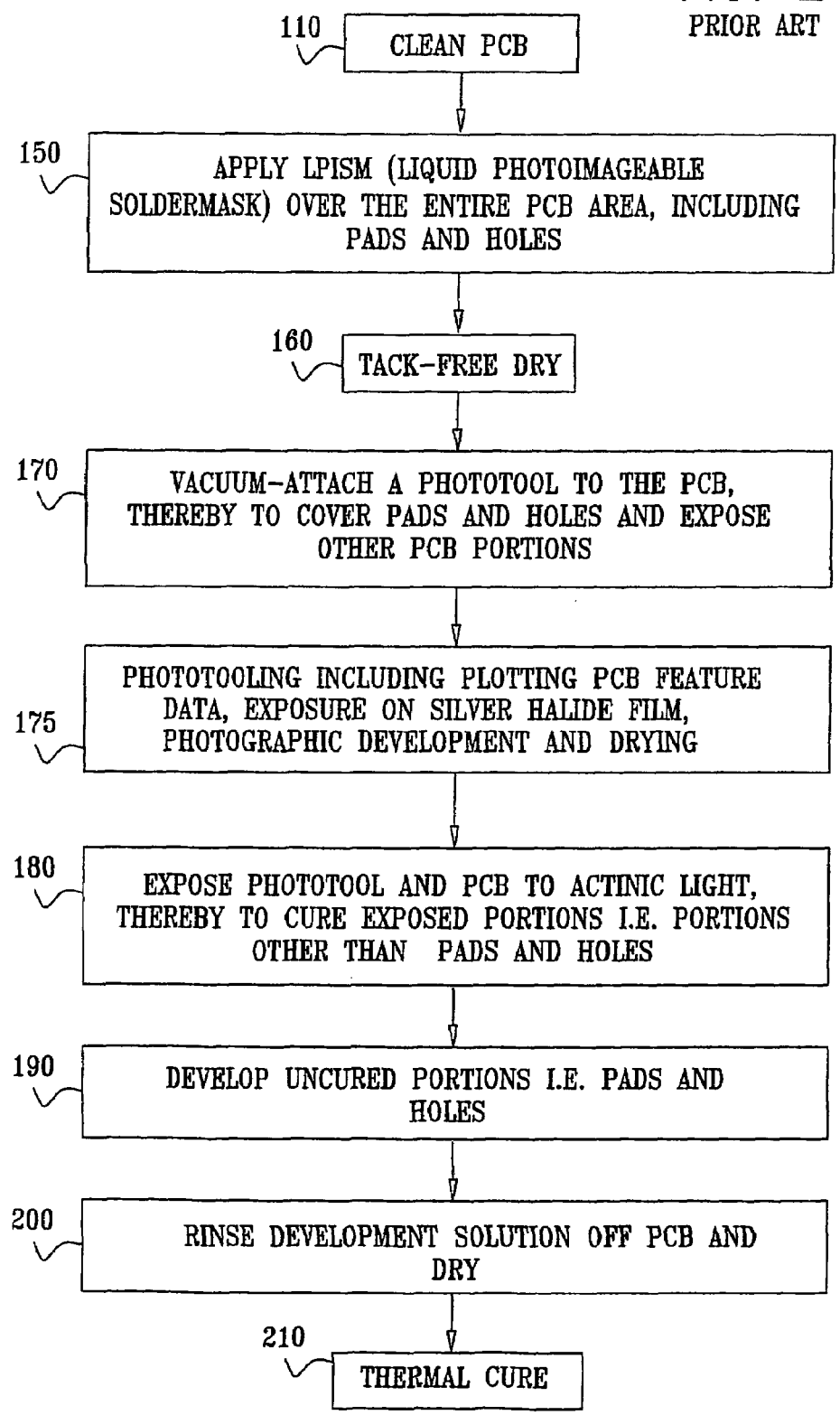
FIG. 2 is a simplified flowchart illustration of a prior art method for application of protective soldermask to printed circuit boards.

Reference is now made to FIGS. 1A-1B, which, taken together, form a simplified generally self-explanatory flowchart illustration of a method, constructed and operative in accordance with a preferred embodiment of the present invention, for digital application of protective soldermask to printed circuit boards.

Preferably, the method of FIGS. 1A-1B is implemented using a digital solder resist drop placing system similar to that shown and described in published PCT application PCT/IL01/00596 (WO 02/01929).

In step 50, solder resist drops, also termed herein "ink drops", are placed over the entire area of the board other than in forbidden areas. These drops flood bare portions of the printed circuit board. These bare portions, from which the copper layer has been etched, are also termed herein "the laminate area" of the PCB. The flow of the liquid soldermask in the flooding procedure is stopped by the pads. This step provides close proximity of the soldermask to the pads.

Steps 40, 50 and 60 are a first pass, for covering the entire PCB area. Steps 70 and 80 are a second pass, specifically for covering the conductors which tend to be inadequately covered during the first pass due to the elevated height of the conductors relative to the plane of the PCB.

In step 70, the solder mask is again applied to the board and, this time, fully or partially frozen immediately after having been applied to the board. This both allows solder dams to be built up between the pads and prevents the ink from flowing off the conductors and particularly, the edges thereof. The immediate "freezing" of the soldermask may be effected e.g. by UV curing, by exposure to IR radiation and/or by application of hot air.

Figure 3:
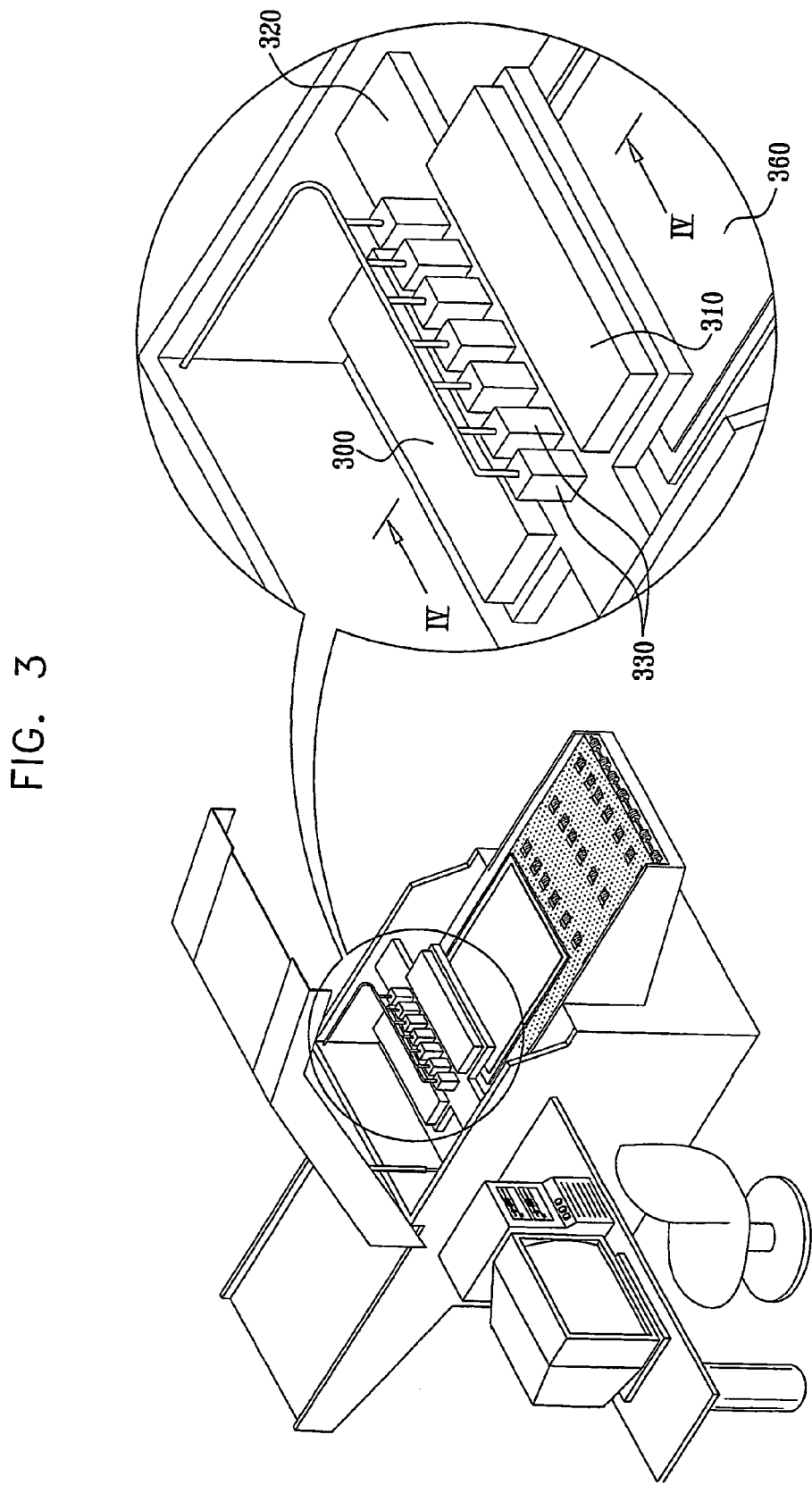
FIG. 3 is a simplified pictorial illustration of apparatus for application of protective soldermask to printed circuit boards, including actinic illumination on both sides of a printhead bridge to enable rapid curing of an object, which, once printed, may exit the printhead bridge from either of two directions.
Figure 4A:
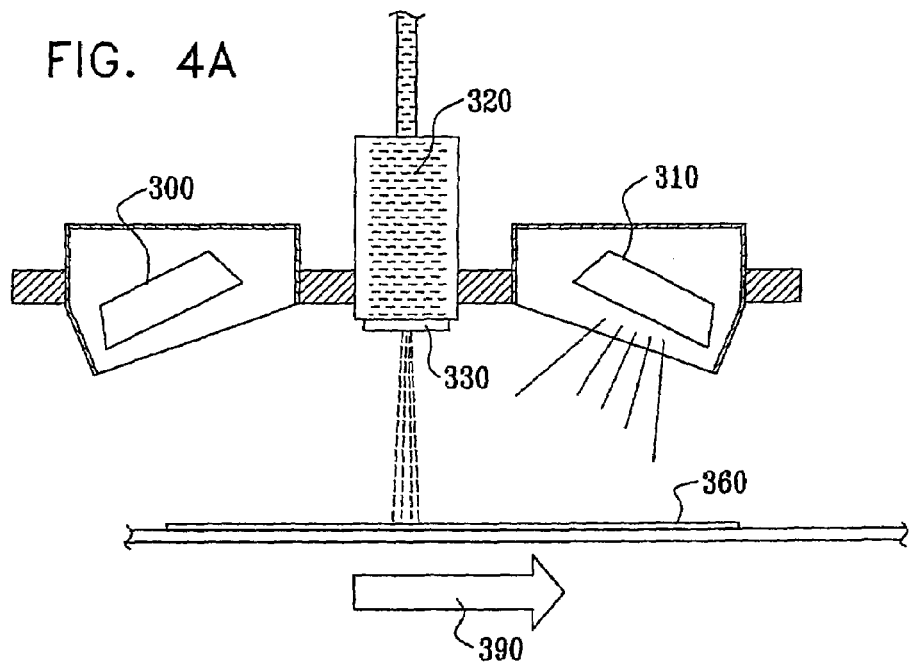
FIGS. 4A-4B are simplified pictorial illustrations, taken along IV-IV of FIG. 3, showing the PCB board passing under the UV curing lamp of the apparatus of FIG. 3, along a first direction e.g. after a first linear portion of the PCB has been covered with soldermask, and along a second direction after a second linear portion of the PCB has been covered with soldermask.
Figure 4B:
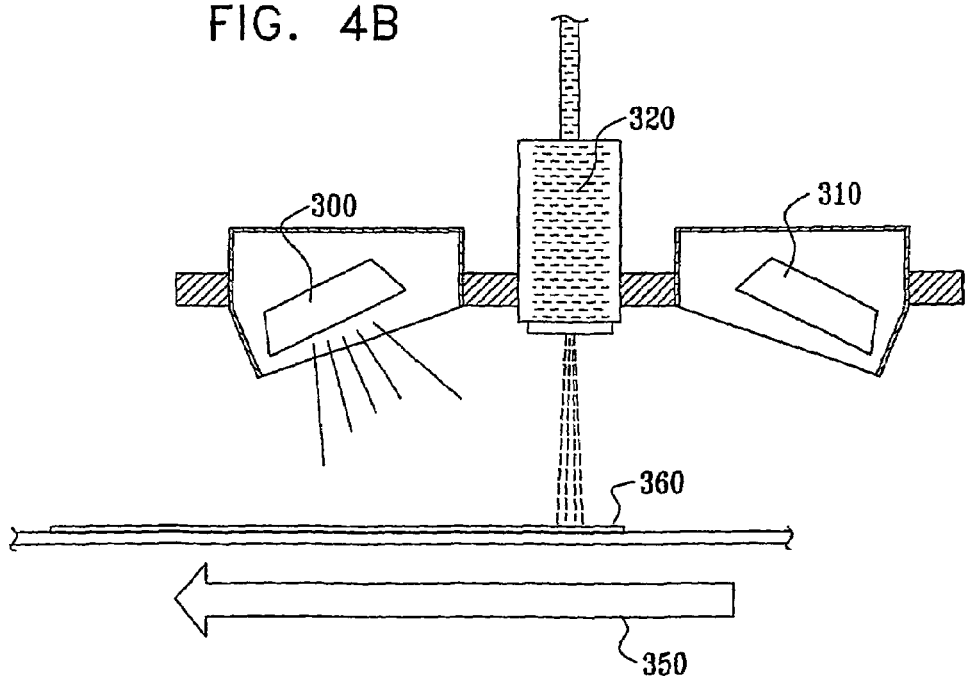

In step 70, the ink is "frozen" on the fly. Typically after 50-200 milliseconds, the printed area on the PCB passes under actinic light and is cured at least partially to insure the immobility of the printed drops. A suitable radiation level for the actinic light is 50-300 mj/cm2 preferably 100-200 mj/cm2. As shown in FIGS. 3-4B, to insure the shortest time between placing the drop on the board and its curing, two actinic light sources 300 and 310 such as UV lamps are typically provided, one on each side of a bridge 320 supporting the printheads 330, such that the PCB 360 may move in either of two directions, as indicated by arrows 340 and 350, through the bridge 320 and in both of the two directions, a UV lamp 300 or 310 is available immediately adjacent to the PCB's exit point from the bridge 320.

In FIGS. 1A-1B, ink is typically applied at the desired sites in 2-6 passes, typically 2-3 passes as shown (step 50, 70 and 80). The number of passes depends on the drop volume, printing frequency and panel velocity, all of which parameters are controllable in state of the art printers such as the Printar LGP-809. For example, if the drop volume is 75 pl and the pixel size (distance between centers of adjacently applied drops) is 33 micrometer, the coated thickness typically exceeds 70 micrometers which far exceeds the conventionally requested 25 micrometer dry coat.

The maximal printing frequency, on the Printar LGP-809 is 20,000 drops per sec. However, typically, a printing frequency is selected, for each of steps 50, 70 and 80, which provides a coating of the desired thickness, and no more. For example, if the desired coating thickness is 20-40 micrometer, a printing frequency of approximately 5000 drops per sec may be employed.

To flood the PCB, approximately 30,000 drops per sqcm must be ejected. This parameter is well within any OEM (Original Equipment Manufacturer) printhead ability such as the Spectra, Xaar or Epson printheads.

A suitable inkjet device for performing the method of FIG. 4 is the LGP-809, commercially available from Printar Ltd., 5 Oppenheimer St., Rehovot, Israel. The apparatus of FIG. 3 may be similar to the LGP-809 or to the apparatus described in the above-referenced copending PCT application, except that two UV lamps may be provided on either side of the printhead bridge as shown.

Steps 30, 40 and 45 of FIGS. 1A-1B may be performed by the RIP function of the Printar LGP-809 printer. Preferably, in step 40, binarization is performed such that pads, holes, and a margin of suitable width such as 50-100 micrometers surrounding each pad and each hole are all defined as "forbidden areas" i.e. areas where no soldermask is to be applied. In step 45, it is typically not necessary to surround each conductor and/or solder dam with a margin to be covered due to the fact that drops preferably "freeze" immediately after the ink is applied.

The LGP-809 yields an ink drop localization accuracy of 25-80 micrometers and may have a drop volume of 20-100 picoliters. For example: a drop of 75 picoliters ejected e.g. by the LGP-809 inkjet device may generate, on media, a spot whose diameter is 80-120 micrometers, the diameter depending on the interaction between the media and the ejected ink.

For example, ink drops may be distributed over the entire coated PCB surface, other than pad areas, whose centers are spaced approximately 33 micrometer apart. Around each pad area, the centers are spaced approximately 60-80 micrometer from the edges of the pad. This process may be repeated in order to achieve a desired thickness across the entire area of the coated PCB or in certain designated areas thereof. For example, if the pad thickness is 35 micrometer, the process may be repeated 1-4 times in the vicinity of the pads. If the pad thickness is 140 micrometer, the process may be repeated 4-16 times in the vicinity of the pads.

For example, ink drops may be distributed over the entire coated PCB surface, other than pad areas, whose centers are spaced approximately 33 micrometer apart. Around each pad area, the centers are spaced approximately 60-80 micrometer from the edges of the pad. This process may be repeated in order to achieve a desired thickness across the entire area of the coated PCB or in certain designated areas thereof. For example, if the pad thickness is 35 micrometer, the process may be repeated 1-4 times in the vicinity of the pads. If the pad thickness is 140 micrometer, the process may be repeated 2-8 times in the vicinity of the pads.

In order to cover conductors adequately, the flow of ink off the conductors is preferably minimized by using ink with a UV component to facilitate in situ curing thereby to inhibit flow off the conductors. A suitable commercially available ink, for example, is Avecia's Solder Mask Z3727/6/1.

A particular feature of a preferred embodiment of the present invention is that each ink drop ejected by the jet typically, assuming drop ejection density is within a suitable range, spreads to the edge of any nearby elevated pad and stops just at the edge. A suitable value for drop ejection density DPIY along the y-axis d may be computed by hand or by suitable software, e.g. as follows:

$$DPIY = 25.4 \times 25.4 \times T/(DPIX \times Vd),$$

where 25.4 is an inch-mm conversion factor, T is the desired thickness of ink on the PCB in mm, DPIX is the drop ejection density along the x-axis, which is usually a fixed, native parameter of the printer, and Vd is the volume of each ejected drop in picoliters, which can be determined empirically under working conditions. DPIX and DPIY values are given in drops per inch. High printing resolution can be achieved even if a relatively low ejection density is desired by operating a printer at relatively high resolution, e.g. 750 dpi, but adjusting the printer controls so as to eject, in fact, less than 750 drops per inch, e.g. 375 drops per inch.

It is appreciated that the software components of the present invention may, if desired, be implemented in ROM (read-only memory) form. The software components may, generally, be implemented in hardware, if desired, using conventional techniques.

It is appreciated that various features of the invention which are, for clarity, described in the contexts of separate embodiments may also be provided in combination in a single embodiment. Conversely, various features of the invention which are, for brevity, described in the context of a single embodiment may also be provided separately or in any suitable subcombination.

It will be appreciated by persons skilled in the art that the present invention is not limited to what has been particularly shown and described hereinabove. Rather, the scope of the present invention is defined only by the claims that follow:

The invention claimed is:

1. A method for applying soldermask, according to a soldermask pattern, to a printed circuit board having elevated pads defining pad edges and conductors, the method comprising:

in one pass covering at least a first part of said printed circuit board with soldermask drops, while maintaining at least a predetermined clearance distance from said elevated pads; and thereafter allowing said soldermask drops to flood said at least a first part of said printed circuit board with said soldermask such that said soldermask advances to said pad edges and is stopped thereby and thereat, without climbing onto the elevated pads; and in another pass, covering at least a second part of said printed circuit board including at least some of said conductors with said soldermask drops, while maintaining at least a predetermined clearance distance from said elevated pads; and thereafter freezing said soldermask drops overlying said at least some of said conductors thereby preventing said soldermask from flowing off of said at least some of said conductors.

2. A method according to claim 1 and also comprising:

using an ink jet to eject drops of ink onto the printed circuit board in accordance with the soldermask pattern; and freezing each drop of ink within 100 milliseconds to prevent ink spread.

3. A method according to claim 2 wherein said conductors have conductor edges and wherein said using an ink jet comprises using the ink jet to eject drops of ink over said conductor edges.

4. A method according to claim 2 wherein said elevated pads comprise at least one pair of adjacent elevated pads and wherein said using an ink jet comprises using the ink jet to eject drops of ink between said pair of adjacent elevated pads, thereby to generate a solder dam.

5. A method according to claim 2 wherein said freezing each drop of ink comprises at least one of the following steps: curing with actinic light; IR irradiation; exposure to hot air.

6. A method according to claim 1 and also comprising providing a printed circuit board having at least one holes and wherein said allowing said soldermask drops to flood comprises flooding the printed circuit board other than the immediate vicinity of said holes.

7. A method according to claim 6 wherein each hole has an aspect ratio of at least 10:1.

8. A method according to claim 2 wherein said freezing each drop of ink comprises curing with UV light.

* * * * *